US010727165B2

(12) United States Patent
Ho et al.

(10) Patent No.: US 10,727,165 B2
(45) Date of Patent: *Jul. 28, 2020

(54) CAPPED THROUGH-SILICON-VIAS FOR 3D INTEGRATED CIRCUITS

(71) Applicant: Board of Regents, The University of Texas System, Austin, TX (US)

(72) Inventors: Paul S. Ho, Austin, TX (US); Tengfei Jiang, Orlando, FL (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/235,814

(22) Filed: Dec. 28, 2018

(65) Prior Publication Data

US 2019/0139864 A1   May 9, 2019

Related U.S. Application Data

(63) Continuation of application No. 15/711,241, filed on Sep. 21, 2017, now Pat. No. 10,170,399, which is a
(Continued)

(51) Int. Cl.
*H01L 23/48* (2006.01)
*H01L 25/065* (2006.01)
(Continued)

(52) U.S. Cl.
CPC ...... *H01L 23/481* (2013.01); *H01L 21/76898* (2013.01); *H01L 23/49816* (2013.01);
(Continued)

(58) Field of Classification Search
CPC ............ H01L 23/481; H01L 23/49827; H01L 23/49816; H01L 21/76898; H01L 25/0652; H01L 25/0657; H01L 25/50
See application file for complete search history.

(56) References Cited

U.S. PATENT DOCUMENTS 8,951,906 B2 * 2/2015 Farooq .............. H01L 21/76898
438/618
10,170,399 B2 * 1/2019 Ho ..................... H01L 23/49827
(Continued)

OTHER PUBLICATIONS

International Search Report and Written Opinion of International Searching Authority, International application No. PCT/US16/24186 Filed Mar. 25, 2016, 10 pages, dated Jun. 27, 2017.
(Continued)

*Primary Examiner* — Hsien Ming Lee
(74) *Attorney, Agent, or Firm* — Baker Botts L.L.P.

(57) ABSTRACT

The present disclosure relates to a chip including a wafer, a back-end-of-line (BEOL) layer deposited on the wafer, a chip TSV in the wafer containing a conductive material, and a chip cap layer disposed between the chip TSV and the BEOL layer, and configured to reduce via extrusion of conductive material in the chip TSV during operation of the chip. The present disclosure further includes a 3D integrated circuit including a plurality of electrically connected chips, at least one of which is a chip as described above. The disclosure further relates to a 3D integrated circuit with an interposer, a TSV in the interposer containing a conductive material, and an interposer cap layer configured to reduce via extrusion of the conductive material located in the interposer TSV during operation of the circuit. The present disclosure further includes methods of forming such chips and 3D integrated circuits.

28 Claims, 9 Drawing Sheets

Related U.S. Application Data continuation of application No. PCT/US2016/024186, filed on Mar. 25, 2016.

(60) Provisional application No. 62/138,869, filed on Mar. 26, 2015.

(51) Int. Cl.
| | |
|---|---|
| *H01L 23/498* | (2006.01) |
| *H01L 21/768* | (2006.01) |
| *H01L 25/00* | (2006.01) |
| *H01L 23/14* | (2006.01) |
| *H01L 23/538* | (2006.01) |

(52) U.S. Cl.
CPC ...... *H01L 23/49827* (2013.01); *H01L 25/065* (2013.01); *H01L 25/0652* (2013.01); *H01L 25/0657* (2013.01); *H01L 25/50* (2013.01); *H01L 21/76849* (2013.01); *H01L 23/147* (2013.01); *H01L 23/5384* (2013.01); *H01L 2224/16145* (2013.01)

(56) References Cited

U.S. PATENT DOCUMENTS

| | | |
|---|---|---|
| 2008/0303154 A1 | 12/2008 | Huang et al. |
| 2011/0193235 A1 | 8/2011 | Hu et al. |
| 2012/0142185 A1* | 6/2012 | Park ............... H01L 21/76898 438/667 |
| 2012/0306085 A1* | 12/2012 | West ............... H01L 23/481 257/762 |
| 2013/0252416 A1* | 9/2013 | Takeda ............ H01L 21/486 438/630 |
| 2014/0252632 A1 | 9/2014 | Barth |

OTHER PUBLICATIONS

Jiang, T. et al., "Through-silicon via stress characteristics and reliability impact on 3D integrated circuits," MRS Bulletin, vol. 40, No. 3, pp. 248-256, Mar. 10, 2015.

International Preliminary Report on Patentability received for PCT Patent Application No. PCT/US2016/024186, dated Oct. 5, 2017; 9 pages.

\* cited by examiner

CAPPED THROUGH-SILICON-VIAS FOR 3D INTEGRATED CIRCUITS

RELATED APPLICATIONS

This application is a continuation of U.S. patent application Ser. No. 15/711,241 filed Sep. 21, 2017, which is a continuation of International Application Number PCT/US2016/024186 filed Mar. 25, 2016, which claims the benefit of U.S. Provisional Application Ser. No. 62/138,869 filed Mar. 26, 2015, the contents of which are incorporated by reference herein.

TECHNICAL FIELD

The present disclosure relates to three dimensional (3D) integrated circuits in which the through-silicon-vias (TSVs) are capped to reduce via extrusion.

BACKGROUND 3D integrated circuits contain stacked chips that are electrically connected to one another by chip TSVs that extend vertically through the silicon wafers of the chips. Common chip TSV configurations are shown in FIGS. 1A and 1B (PRIOR ART). In order to establish an electrical connection between chips, the chip TSV contains an electrically conducting material, such as a metal, particularly copper (Cu). This material sometimes extrudes from the via during manufacturing or operation of the 3D integrated circuit, causing damage to structures near the chip TSV as shown in FIG. 1C (PRIOR ART) or cracking of an oxide film that forms on top of the chip TSV as shown in FIG. 1D (PRIOR ART). Both of these effects are detrimental to the 3D integrated circuit and may cause the entire circuit to fail.

Prior to the present invention, causes of via extrusion were poorly understood and effective ways of reducing via extrusion have not been demonstrated.

SUMMARY

The present disclosure relates to a chip including a wafer, a back-end-of-line (BEOL) layer deposited on the wafer, a chip through-silicon-via (TSV) in the wafer, the chip TSV containing a conductive material, and a chip cap layer disposed over the chip TSV and between the chip TSV and the BEOL layer, wherein the chip cap layer is configured to reduce via extrusion of conductive material located in the chip TSV during fabrication or operation of the chip, or both.

The present disclosure further includes a 3D integrated circuit including a plurality of electrically connected chips, at least one of which is a chip as described above.

The present disclosure further includes methods of forming such chips and 3D integrated circuits.

The present disclosure further includes 3D integrated circuits with an interposer TSV and an interposer cap layer as well as 3D integrated circuits containing such an interposer and methods of forming such 3D integrated circuits.

BRIEF DESCRIPTION OF THE DRAWINGS

Embodiments of the present disclosure may be better understood by reference to the attached figures, in which like numerals indicate like components.

DETAILED DESCRIPTION

The present disclosure relates to 3D integrated circuits in which chip TSVs are capped to reduce via extrusion. In particular, the chip TSVs may be capped with a chip cap layer that may be deposited in a manner similar to other layers in the circuit. In addition, the disclosure relates to 3D integrated circuits containing interposer TSVs that are capped with an interposer cap layer that may be deposited in a manner similar to other layers in the circuit. Although the materials and methods herein are primarily described with respect to a chip cap layer, they may be used in connection with an interposer cap layer as well. Interposer cap layers also reduce interposer via extrusion.

Figure 1A:
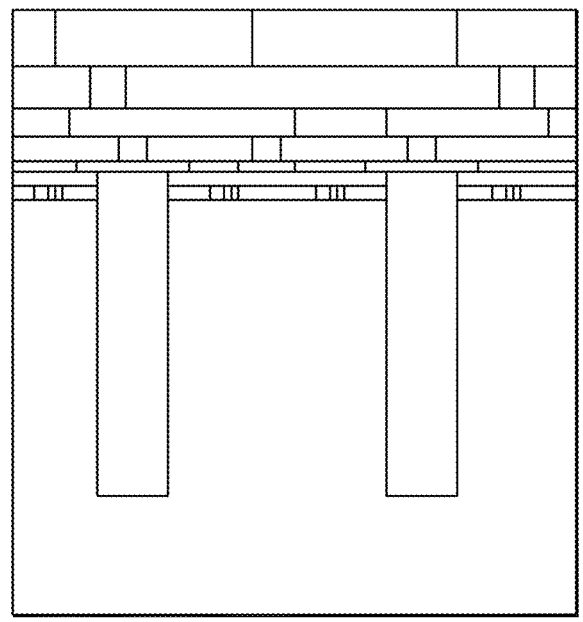
FIG. 1A presents a PRIOR ART chip TSV in a silicon wafer in which a first BEOL metal layer is directly in contact with the top of the chip TSV.
Figure 1B:
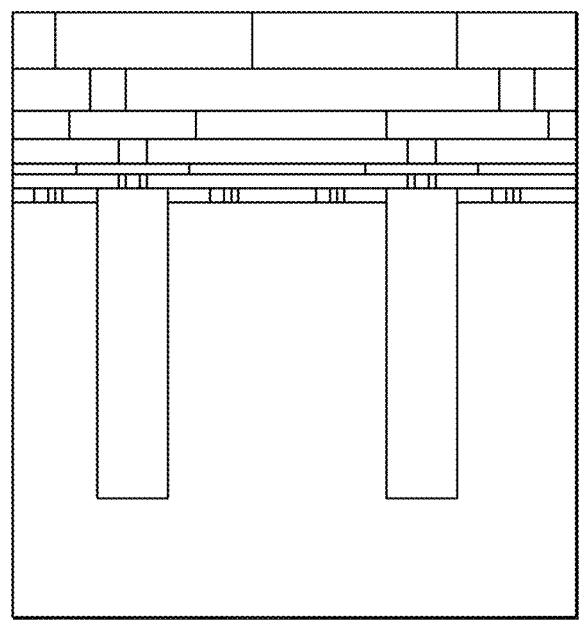
FIG. 1B presents a PRIOR ART chip TSV in which a silicon wafer in which a first BEOL metal layer is connected to the top of the chip TSV by intermediate vias.
Figure 1C:
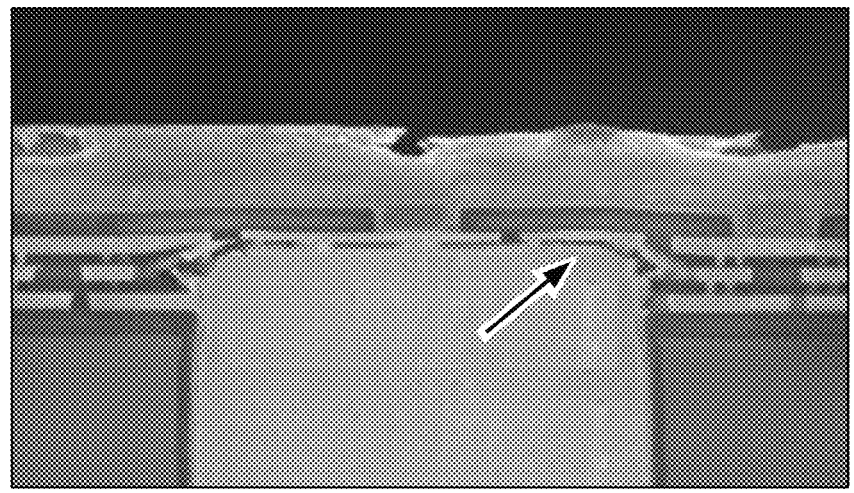
FIG. 1C is micrograph of a PRIOR ART chip TSV that has experienced via extrusion, resulting in damage of the first BEOL metal layer and other structures near the chip TSV.
Figure 1D:
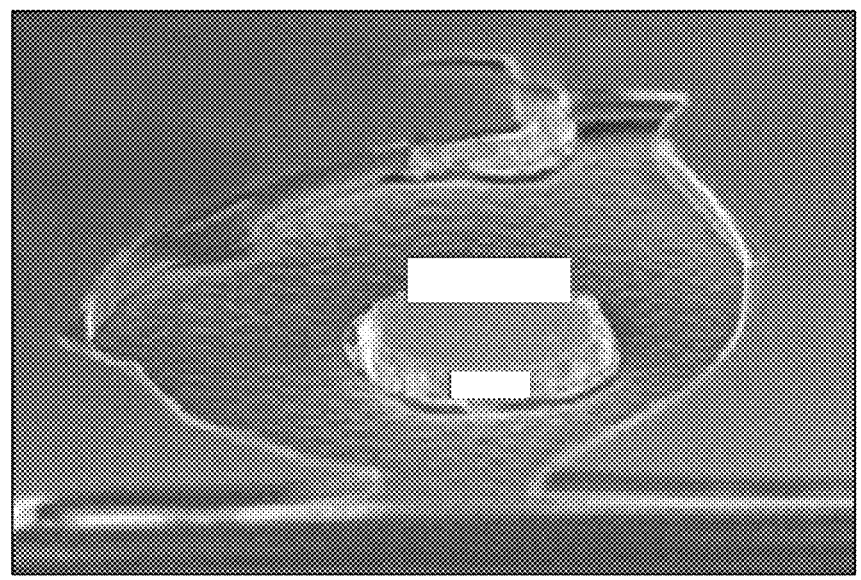
FIG. 1D is a micrograph of a PRIOR ART chip TSV that has experienced via extrusion, resulting in cracking of the oxide film formed on top of the chip TSV.
Figure 2A:
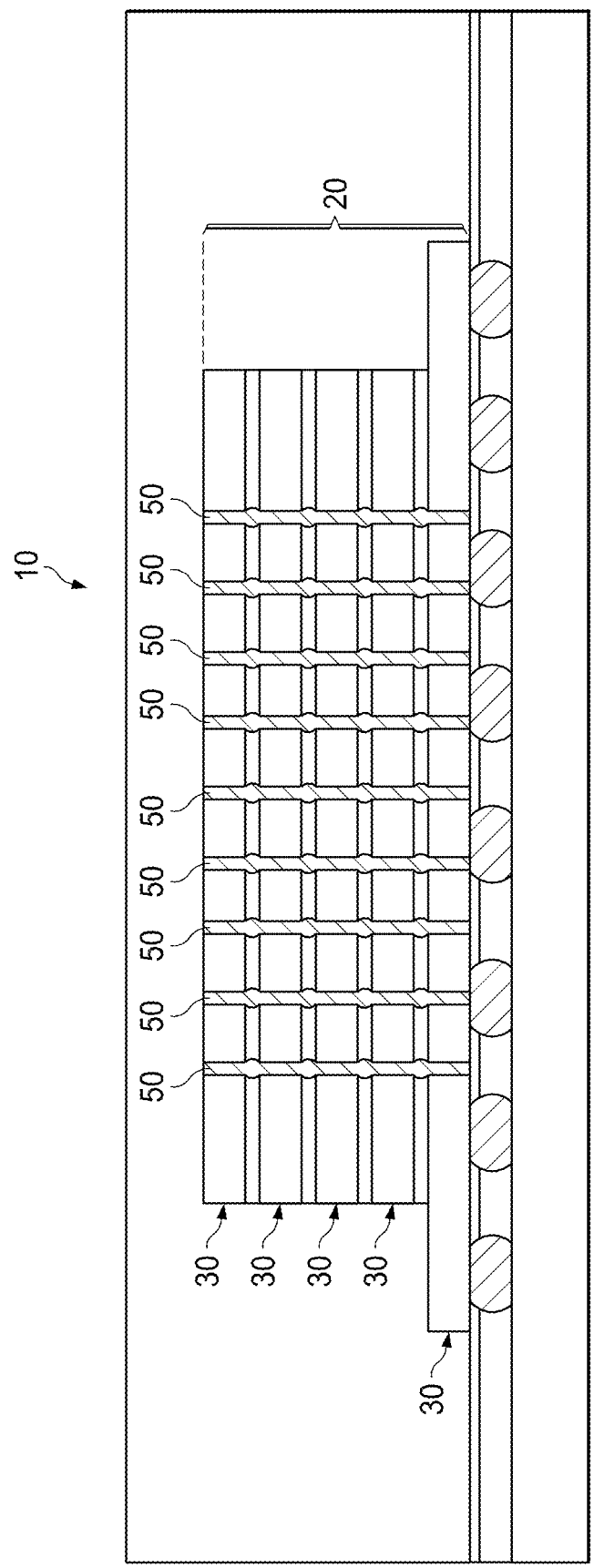
FIG. 2A illustrates a 3D integrated circuit according to the present disclosure.

FIG. 2A illustrates a 3D integrated circuit 10 containing five chips 20. Each chip 20 contains a wafer 30 and a BEOL layer 40 (not expressly shown). Chip TSVs 50 vertically disposed in the silicon wafers 30 connect different chips 20 to create the 3D integrated circuit 10.

Figure 2B:
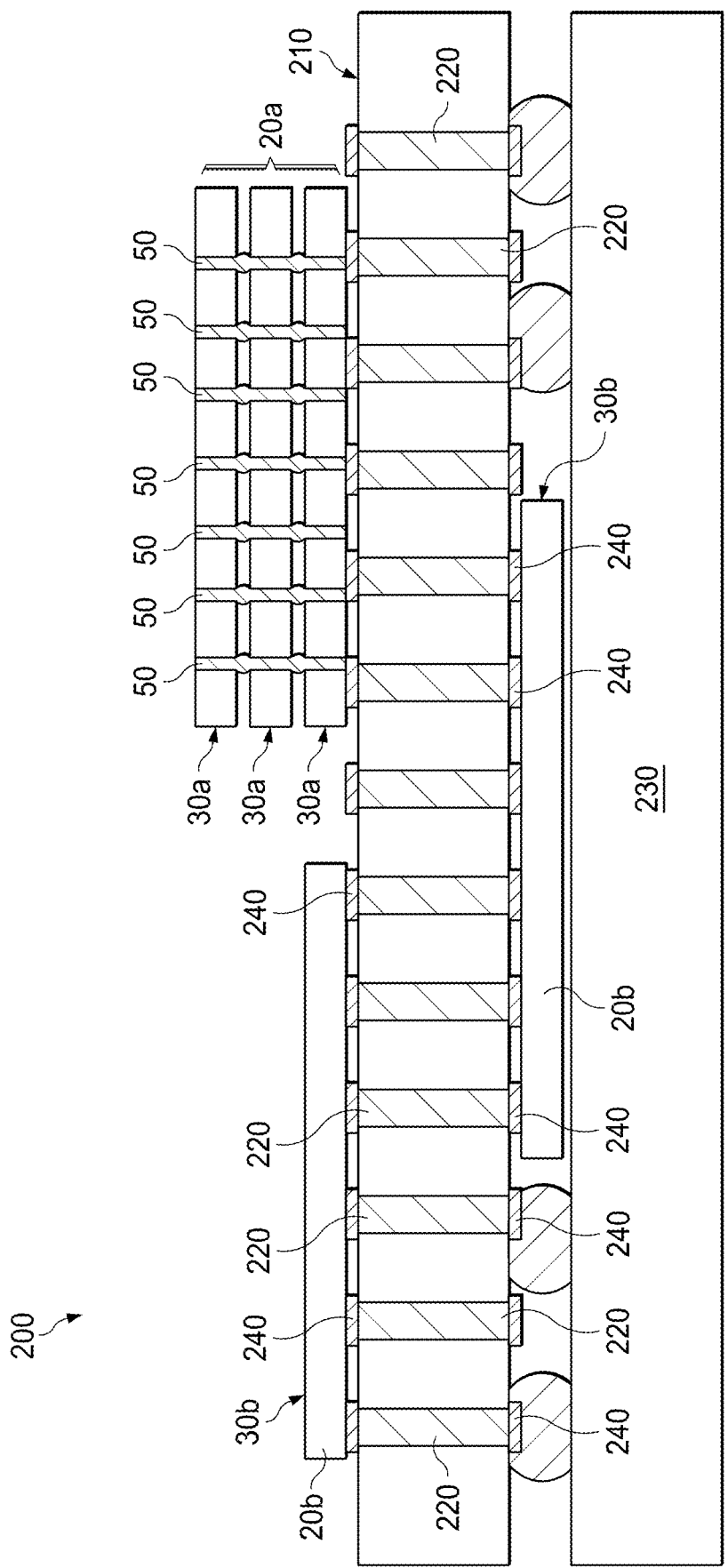
FIG. 2B illustrates a 3D integrated circuit with an interposer (also called a 2.5 dimensional (2.5D) integrated circuit) according to the present disclosure.

FIG. 2B illustrates a 3D integrated circuit 200 containing five chips 20, three stacked chips 20a and two unstacked chips, 20b. Each chip 20a or 20b contains a silicon wafer 30a or 30b. The stacked chips 20a also contain a BEOL layer 40 (not expressly shown). As in FIG. 2A, chip TSVs 50 vertically disposed in silicon wafers 30a connect different chips 20a to create a 3D integrated circuit among chips 20a. In addition, stacked chips 20a and unstacked chips 20b are disposed in interposer 210 to create a 3D integrated circuit with an interposer (also referred to as a 2.5D circuit) on which chips 20a and 20b are located. The 3D circuit further includes a substrate, 230.

As illustrated in FIG. 2B, 3D integrated circuit with interposer 200 includes both stacked chips 20a and unstacked chips 20b. 3D integrated circuits with only stacked chips or only unstacked chips are also included in this disclosure. Furthermore, although chips 20a and 20b are shown on both sides of interposer 210 in FIG. 2B, 3D integrated circuits with chips on only one side are also included in this disclosure.

Interposer 210 contains a plurality of interposer TSVs 220, which may be covered with an interposer cap layer 240.

Interposer 210 may be formed from any suitable material, such as any material conventionally used to form an interposer. Suitable materials include silicon and other electrically insulating materials.

The disclosure further includes other 3D integrated circuits containing chip TSVs, interposer TSVs, or both. The capped TSVs illustrated in FIGS. 3A and 3B, as well as the methods described in FIGS. 4A-4H and FIGS. 5A-5H may be used with any 3D integrated circuit, including those of FIGS. 2A and 2B.

Figure 3A:
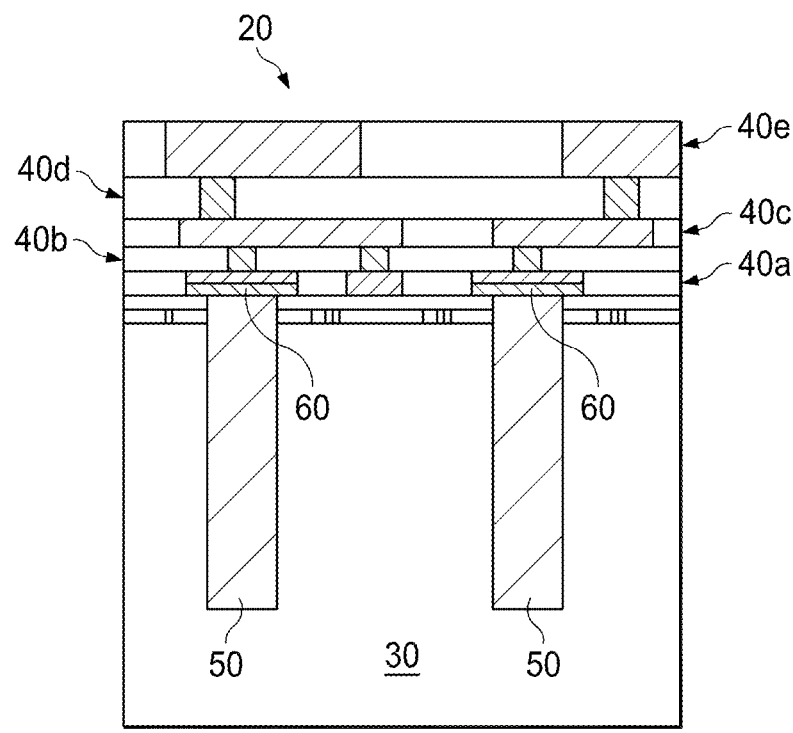
FIG. 3A illustrates a capped chip TSV according to the present disclosure.
Figure 3B:
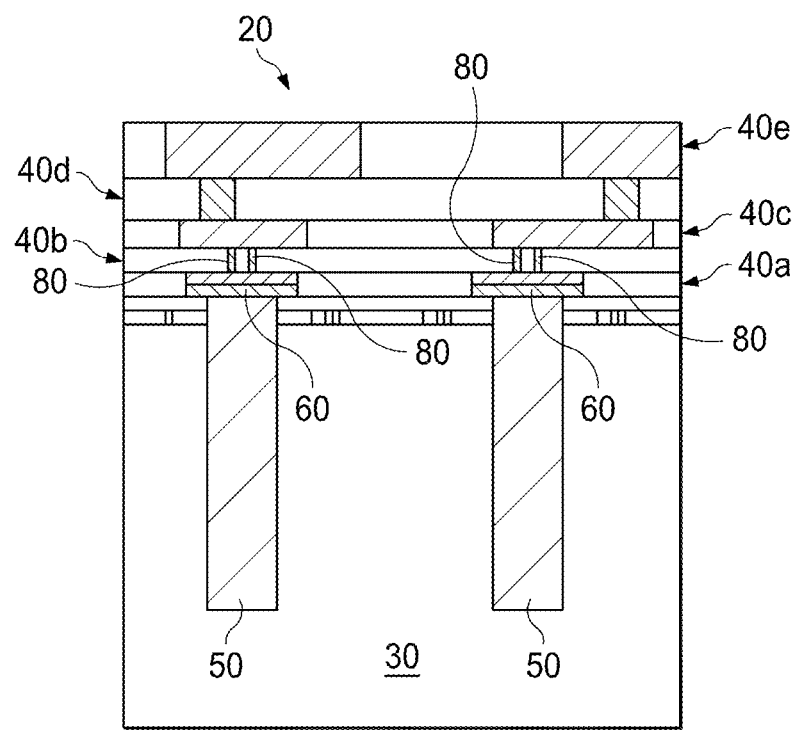
FIG. 3B illustrates another capped chip TSV according to the present disclosure.

FIGS. 3A and 3B illustrate capped chip TSVs 50 in chips 20. In these chips 20, the chip TSVs 50 are each covered with a cap layer 60. Although it is possible to cap only selected chip TSVs 50, generally it is desirable to cap all of them on a chip 20. BEOL layer 40 includes sublayers 40a-e.

In FIG. 3A, capped chip TSV 50 is directly in contact with the first BEOL layer 40a. This is often referred to as a one-level wiring structure.

In FIG. 3B, capped chip TSV 50 is electrically connected to first BEOL layer 40a by intermediate vias 80 found in intermediate layer 40b. This is often referred to as a two-level wiring structure. This design is often used in chips 20 at the 20 nm technology node or smaller because of its increased compatibility with smaller-scale BEOL interconnects.

Although it is possible to form hybrid chips in which some chip TSVs 50 are in direct contact with first BEOL layer 40a and other chip TSVs 50 on the same chip are electrically connected by intermediate vias 80 in intermediate layer 40b, typically a chip or a substantial region of a chip will use one design or the other for all chip TSVs due to manufacturing efficiencies.

Wafers 30 may be any semiconducting material, suitable for forming a 3D integrated circuit, including silicon, such as n-doped and p-doped silicon. Although the present disclosure focuses on silicon as the most common integrated circuit material, the principles may be applied to integrated circuits formed from other semiconductor wafers, such as gallium arsenide wafers or other compound III-V or II-VI material wafers as well.

Chip TSV 50 may be wholly or partially filled with an electrically conductive material sufficient to establish an electrical connection between two chips 20. Often the electrically conductive material is metallic Cu or a Cu alloy, but other materials may be used. The principles applied herein and discussed in connection with Cu may be applied to such other materials.

Cap layer 60 may be formed by any metal or metal alloy able to reduce or prevent via extrusion from the associated chip TSV 50. In order to do this, when exposed to an elevated temperature, such as during fabrication or operation of the chip or the 3D integrated circuit, the cap layer 60 may reduce or prevent material extrusion due to diffusion (also called mass transport) at a surface/interface or a grain boundary resulting from stresses generated by differences in the coefficient of thermal expansion (CTE) (i.e. how much the material changes in size in response to a change in temperature) of the material in chip TSV 50 as compared to silicon or other semiconducting material in wafers 30. Stresses generated by CTE differences cause interfacial or grain-boundary diffusion because both interfacial and grain-boundary diffusion are types of thermally-activated mass transport. Grain-boundary diffusion occurs along the boundaries of separate grains in a crystal and is characterized by atomic transport along these boundaries. This atomic transport occurs more readily under a stress which is generated when the grains change size in response to a temperature change. Interfacial diffusion occurs at the interface between two different materials, often to relieve stresses such as those caused by one material changing more in size due to a change in temperature than the other material. In addition, grain-boundary diffusion and interfacial diffusion may be affected by the reaction of cap layer 60 with the material in chip TSV 50.

In addition to reducing or preventing via extrusion, the material used to form cap layer 60 may also be compatible with manufacturing processes used to form chip 20 or a 3D integrated circuit, such as 3D integrated circuit 10 or 200.

When wafer 30 is formed from silicon and chip TSV 50 is filled with Cu or a Cu alloy, metallic elements which can react or alloy with Cu, such as cobalt (Co), titanium (Ti), nickel (Ni), aluminum (Al), alloys thereof, and combinations of any of the foregoing may be used to form cap layer 60.

Cap layer 60 may react with the underlying material in chip TSV 50 to form an alloying layer at the interface. Cap layer 60 may also partially dissolve at the surface/interface and/or into grain boundaries in the underlying material in chip TSV 50. These effects reduce grain boundary diffusion or surface/interfacial diffusion.

Cap layer 60 may have any dimensions suitable for use in chip 20 so long as cap layer 60 remains capable of reducing or preventing via extrusion. For example, cap layer 60 may be between 5 and 100 nm thick, between 10 and 75 nm thick, between 15 and 50 nm thick, at least 5 nm thick, at least 10 nm thick, or at least 15 nm thick. Cap layer 60 typically covers the entire top of chip TSV 50. It may extend beyond chip TSV 50 by at least 5 nm, or at least 10 nm at the smallest extent. Suitable thickness and extensions for cap layer 60 may be affected by the material used to form wafer 30, the material contained in chip TSV 50, the material contained in interposer TSV, the material used to form layer 40a or other BEOL layers, and the material from which cap layer 60 is formed.

Cap layer 60 may reduce via extrusion under conditions at which via extrusion by a certain amount as compared to normally occurs during thermal cycling between room temperature and around 400° C., for example, by at least 50%, by at least 75%, or by at least 80% when via extrusion is measured as the distance above the normal top of chip TSV 50 to which the material contained in chip TSV 50 has extruded.

Inclusion of cap layer 60 may increase the yield of chip TSVs 50. Inclusion of cap layer 60 may increase the reliability of chip TSVs. Inclusion of an interposer cap layer may also increase the yield or reliability, or both, of interposer TSVs 220. The amount of improvement in yield and reliability may depend on the design of the chip, the BEOL layer materials, the interposer, and the manufacturing process.

Figure 4A:
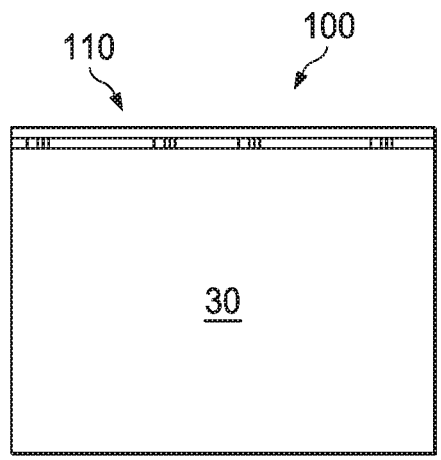
FIGS. 4A-4H illustrate the steps of a method of forming a capped chip TSV according to FIG. 3A.
Figure 4B:
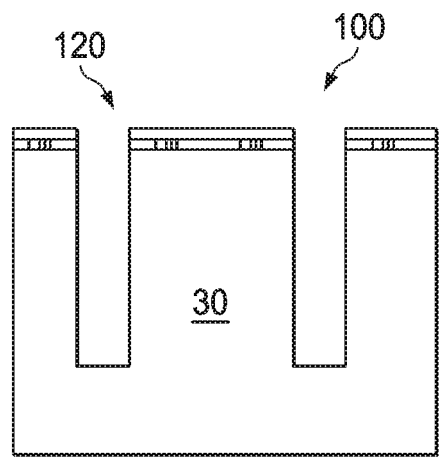
Figure 4C:
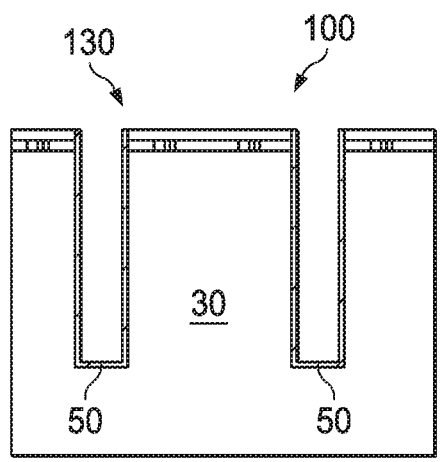
Figure 4D:
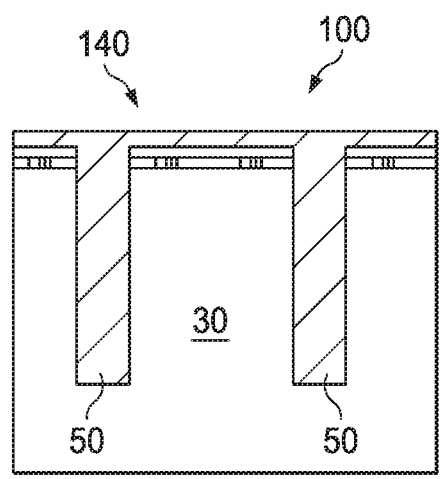
Figure 4E:
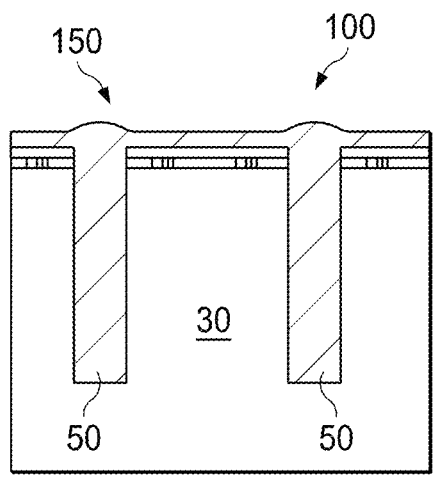
Figure 4F:
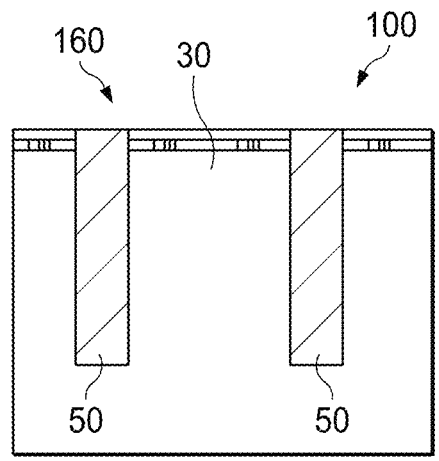
Figure 4G:
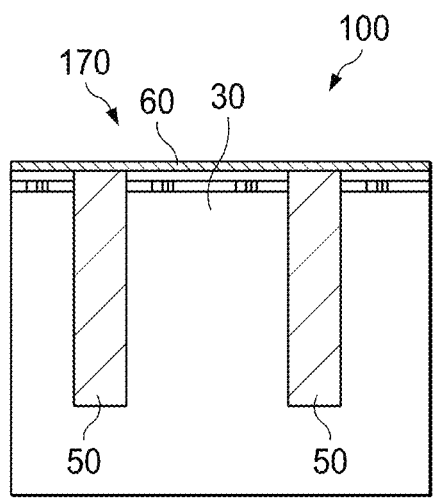
Figure 4H:
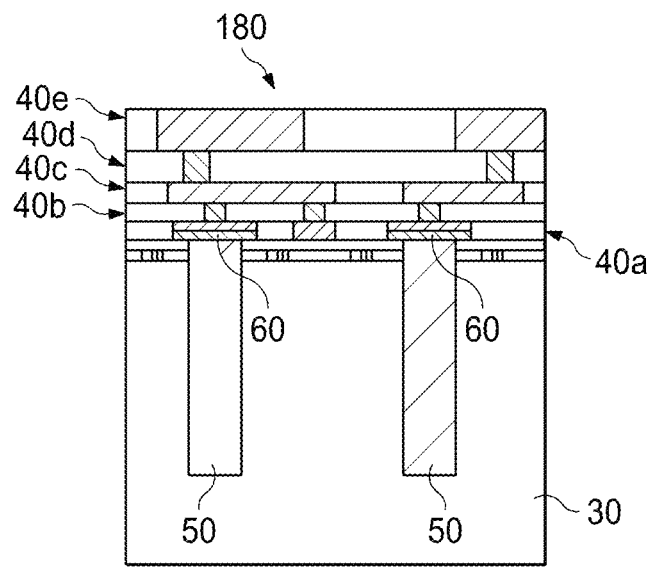
Figure 5A:
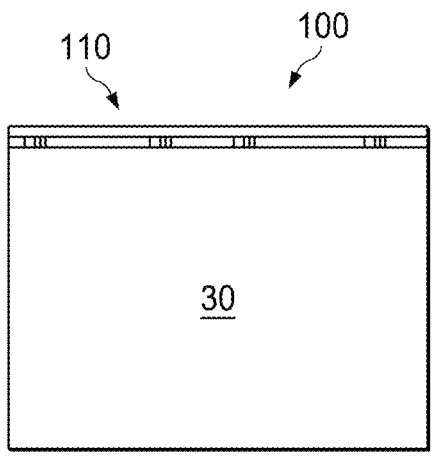
FIGS. 5A-5H illustrate the steps of a method of forming a capped chip TSV according to FIG. 3B.
Figure 5B:
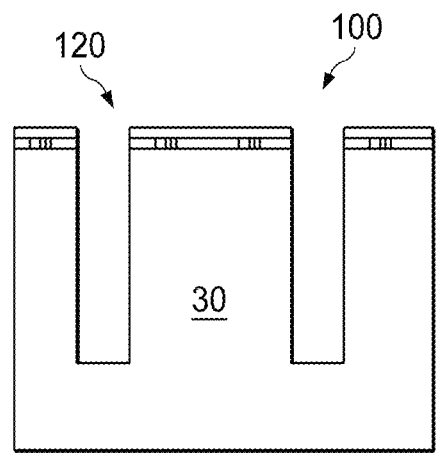
Figure 5C:
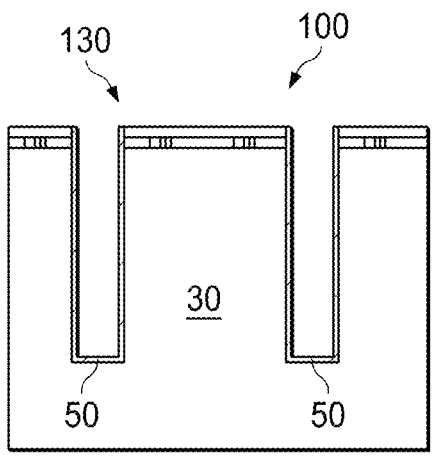
Figure 5D:
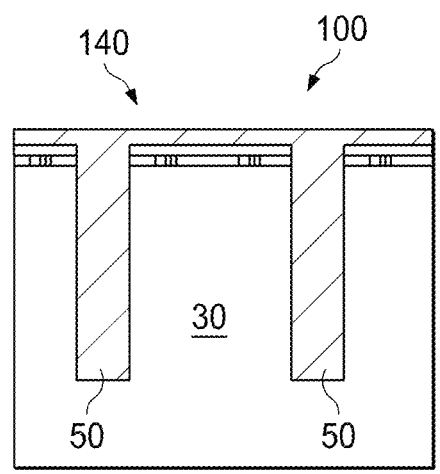
Figure 5E:
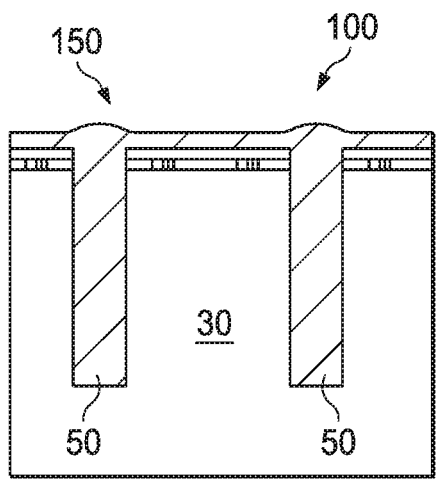
Figure 5F:
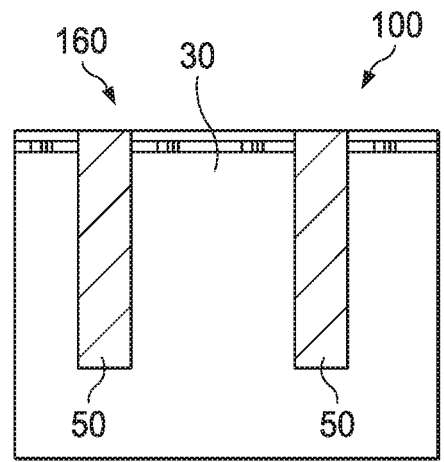
Figure 5G:
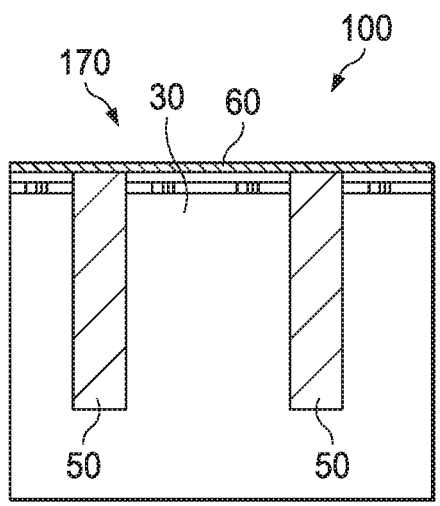
Figure 5H:
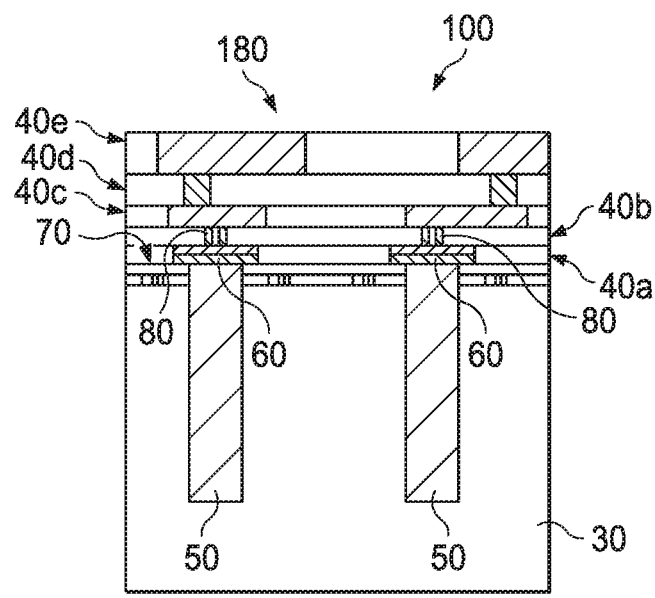

FIGS. 4A-4H and FIGS. 5A-5H illustrate methods 100 of forming capped chip TSVs 50 according to FIGS. 3A and 3B, respectively. In FIGS. 4A and 5A, in a first step 110, wafer 30 after any front-end-of-line (FEOL) process is provided. Next, in FIGS. 4B and 5B, in step 120, chip TSV holes are formed by etching. In FIGS. 4C and 5C, in step 130, a liner and seed layer is deposited in the chip TSV holes. In FIGS. 4D and 5D, in step 140, the chip TSV holes are filled with electrically conductive material, such as Cu or a Cu alloy, to form chip TSVs 50. Filling may include electroplating. Post-plating annealing occurs in FIGS. 4E and 5E in step 150, followed by chemical-mechanical planarization (CMP) in FIGS. 4F and 5F in step 160. A cap layer is deposited in FIGS. 4G and 5G in step 170. Cap layer may be deposited using fabrication techniques otherwise applicable to chip manufacture, such as plasma enhanced sputtering or electroplating, so long as the techniques are otherwise compatible with the methods of forming chip 20 or 3D integrated circuit 10. Cap layer 60 is patterned to cover the tops of chip TSVs 50 for example using the an additive patterning or damascene process or any other compatible process prior to FIGS. 4G and 5H, step 180, in which the BEOL layer 40 is deposited. In FIG. 5H, step 180 further includes depositing the intermediate layer 80 prior to depositing BEOL layer 40. In step 180, BEOL layer 40 may also be patterned.

Further completion processes may then be performed. Such processes may include wafer thinning to reveal the chip TSV backside and/or forming a die-stack structure.

A similar method may be used to place a cap layer on interposer TSVs, such as interposer cap layer 240 located as illustrated in FIG. 2B. Interposer cap layer 240 may be formed by depositing a cap layer material on the interposer using fabrication techniques otherwise applicable to chip manufacture, such as plasma enhanced sputtering or electroplating, so long as the techniques are otherwise compatible with the methods of forming 3D integrated circuit 200. Interposer cap layer 140 is then patterned to cover the tops of interposer TSVs 220 for example using an additive patterning or damascene process or any other compatible process.

EXAMPLES

The following example is provided to further illustrate certain aspects of the present invention. Although it may be used in combination with any embodiments disclosed herein, it is not intended to limit those embodiments to the specific information and data of this example.

Cu-filled chip TSVs were formed in a silicon wafer and capped with different cap materials as indicated in Table 1. Average via extrusion for a group of chip TSVs was measured under conditions in which via extrusion typically occurs during thermal cycling between room temperature and around 400° C. and is also reported in Table 1.

TABLE 1

Average Via Extrusion for Chip TSVs with Various Cap Layer Compositions

| Cap material (thickness) | Average via extrusion |
| --- | --- |
| No cap | 163.6 nm |
| Co (16 nm) | 54.2 nm |
| Ti (50 nm) | 64.5 nm |
| Ni (50 nm) | 46.9 nm |
| Al (50 nm) | 83.6 nm |

Although only exemplary embodiments of the invention are specifically described above, it will be appreciated that modifications and variations of these examples are possible without departing from the spirit and intended scope of the invention. For instance, the principles of the present disclosure may be adapted for use in other fabrication processes, such as via-last processes, via-middle processes, direct chip attachment, or for other integrated packages, such as a fan-out wafer level package. In addition, numerical values referenced herein include the referenced number and may also include "about" the referenced number, unless it is clear from context that only the referenced number was intended.

The invention claimed is:

1. A chip comprising:
   a wafer;
   a back-end-of-line (BEOL) layer deposited on the wafer;
   a chip through-silicon-via (TSV) in the wafer, the chip TSV containing a conductive material; and
   a chip cap layer disposed over the chip TSV and between the chip TSV and the BEOL layer, wherein the chip cap layer is configured to reduce via extrusion of the conductive material located in the chip TSV during fabrication or operation of the chip, or both.

2. The chip of claim 1, wherein the wafer is formed from silicon.

3. The chip of claim 1, wherein the BEOL layer is formed from metal.

4. The chip of claim 1, wherein the BEOL layer comprises a plurality of sublayers.

5. The chip of claim 1, wherein the conductive material is a metal or metal alloy.

6. The chip of claim 5, wherein the metal comprises copper (Cu) or a Cu alloy.

7. The chip of claim 1, wherein the chip cap layer comprises a metal or metal alloy.

8. The chip of claim 7, wherein the chip cap layer comprises metallic elements which react with copper (Cu), alloy with Cu, or both.

9. The chip of claim 8, wherein the metallic elements comprise cobalt (Co), titanium (Ti), nickel (Ni), aluminum (Al), alloys thereof, or combinations of any of the foregoing.

10. The chip of claim 1, wherein the chip cap layer reduces via extrusion by an amount that improves chip yield and reliability.

11. The chip of claim 10, wherein the chip cap layer reduces via extrusion by 50% when measured as distance extruded above the chip TSV during normal operation of the chip.

12. The chip of claim 1, wherein the chip cap layer comprises a metallic element that reduces grain boundary diffusion, surface/interface diffusion, or both of a material located in the chip TSV.

13. A three dimensional (3D) integrated circuit comprising:
   a plurality of electrically connected chips, at least one chip comprising
   a wafer;
   a back-end-of-line (BEOL) layer deposited on the wafer;
   a chip through-silicon-via (TSV) in the wafer, the chip TSV containing a conductive material; and
   a chip cap layer disposed over the chip TSV and between the chip TSV and the BEOL layer, wherein the chip cap layer is configured to reduce via extrusion of the conductive material located in the chip TSV during operation of the chip; and
   an interposer disposed under the plurality of electrically connected chips.

14. The 3D integrated circuit of claim 13, wherein the wafer is formed from silicon.

15. The 3D integrated circuit of claim 13, wherein the BEOL layer is formed from metal.

16. The 3D integrated circuit of claim 13, wherein the BEOL layer comprises a plurality of sublayers.

17. The 3D integrated circuit of claim 13, wherein the conductive material located in the chip TSV is a metal or metal alloy.

18. The 3D integrated circuit of claim 17, wherein the metal comprises copper (Cu) or a Cu alloy.

19. The 3D integrated circuit of claim 13, wherein the chip cap layer comprises a metal or metal alloy.

20. The 3D integrated circuit of claim 19, wherein the chip cap layer comprises metallic elements which react with copper (Cu), alloy with Cu, or both.

21. The chip of claim 20, wherein the metallic elements comprise cobalt (Co), titanium (Ti), nickel (Ni), aluminum (Al), alloys thereof, or combinations of any of the foregoing.

22. The 3D integrated circuit of claim 13, wherein the chip cap layer reduces via extrusion by an amount that improves chip yield and reliability.

23. The 3D integrated circuit of claim 22, wherein the chip cap layer reduces via extrusion by 50% when measured as distance extruded above the chip TSV during normal operation of the chip.

24. The 3D integrated circuit of claim 23, wherein at least two chips of the plurality of electrically connected chips are stacked.

25. The 3D integrated circuit of claim 13, wherein the chip cap layer includes metallic elements that reduce grain boundary diffusion, surface/interface diffusion, or both of a material located in the chip TSV.

26. The 3D integrated circuit of claim 13, comprising at least two chips of the plurality of electrically connected chips are stacked.

27. The 3D integrated circuit of claim 13, wherein at least two chips of the plurality of electrically connected chips are not stacked.

28. The 3D integrated circuit of claim 13, wherein at least two chips of the plurality of electrically connected chips are located on opposite sides of an interposer.

* * * * *